(12) United States Patent
Chiu et al.

(10) Patent No.: US 9,014,870 B2
(45) Date of Patent: Apr. 21, 2015

(54) CONTAINER SYSTEM, CABINET, AND HEAT DISSIPATION METHOD FOR CONTAINER SYSTEM

(75) Inventors: Kuo-Shu Chiu, Taipei (TW); Chien-Chou Chen, Taipei (TW); Szu-Hsien Lee, Taipei (TW); Hsing-Yi Chen, Taipei (TW)

(73) Assignee: Inventec Corporation, Taipei (TW)

( * ) Notice: Subject to any disclaimer, the term of this patent is extended or adjusted under 35 U.S.C. 154(b) by 535 days.

(21) Appl. No.: 13/434,814

(22) Filed: Mar. 29, 2012

(65) Prior Publication Data

US 2013/0166091 A1 Jun. 27, 2013

(30) Foreign Application Priority Data

Dec. 26, 2011 (TW) .............................. 100148612 A

(51) Int. Cl.
G06F 19/00 (2011.01)
G05D 23/19 (2006.01)
H05K 7/14 (2006.01)
H05K 7/20 (2006.01)

(52) U.S. Cl.
CPC .......... *G05D 23/1934* (2013.01); *H05K 7/1497* (2013.01); *H05K 7/20836* (2013.01)

(58) Field of Classification Search
USPC .......... 700/300, 299, 275, 276; 454/184, 343; 361/695; 165/104.3
See application file for complete search history.

(56) References Cited

U.S. PATENT DOCUMENTS

| | | | | |
|---|---|---|---|---|
| 6,574,104 B2 * | 6/2003 | Patel et al. | .................... | 361/695 |
| 6,957,544 B2 * | 10/2005 | Dobbs et al. | .................... | 62/178 |
| 7,074,123 B2 * | 7/2006 | Bettridge et al. | ............. | 454/184 |
| 7,643,291 B2 * | 1/2010 | Mallia et al. | ................... | 361/695 |
| 8,346,398 B2 * | 1/2013 | Ahmed et al. | ................ | 700/278 |
| 8,606,427 B2 * | 12/2013 | Chan et al. | .................... | 700/300 |
| 8,700,188 B2 * | 4/2014 | Wu | ................................ | 700/25 |
| 2005/0011208 A1 * | 1/2005 | Dobbs et al. | .................... | 62/178 |
| 2012/0071076 A1 * | 3/2012 | Wei et al. | ...................... | 454/184 |
| 2012/0215359 A1 * | 8/2012 | Michael et al. | ............... | 700/275 |
| 2012/0257438 A1 * | 10/2012 | Siau et al. | ..................... | 365/148 |

* cited by examiner

*Primary Examiner* — Kidest Bahta
(74) *Attorney, Agent, or Firm* — Tim Tingkang Xia, Esq.; Morris, Manning & Martin, LLP

(57) ABSTRACT

A container system including cabinets, a main control unit connected to the cabinets and a heat dissipation zone is mentioned. The cabinet includes a plurality of serving zones each of which further includes a master server and at least one slave server. The heat dissipation zone is disposed at a side of the serving zone and coupled to the main control unit. Each slave server is coupled to the master server. The slave server includes at least one temperature sensor, and the temperature sensor is used for outputting temperature information to the master server when receiving the temperature demand. The master server collects the temperature information transmitted by each slave server. The master server forwards the temperature information to the main control unit. The main control unit drives the heat dissipation zone to dissipate heat of the serving zone according to the temperature information.

9 Claims, 5 Drawing Sheets

CONTAINER SYSTEM, CABINET, AND HEAT DISSIPATION METHOD FOR CONTAINER SYSTEM

CROSS-REFERENCE TO RELATED APPLICATIONS

This non-provisional application claims priority under 35 U.S.C. §119(a) on Patent Application No(s). 100148612 filed in Taiwan, R.O.C. on Dec. 26, 2011, the entire contents of which are hereby incorporated by reference.

BACKGROUND

1. Technical Field

The present disclosure relates to a heat dissipation method, and in particular, to a method for collecting temperature information of a cabinet and heat dissipation method for a container system.

2. Related Art

As technologies are advanced, the processing capability of a computer is significantly improved. Due to the improvement of the processing capability of the computer, the temperature of a central processing unit (CPU) in operation increases rapidly. Currently, a fan or a heat dissipation fin is disposed on the CPU or a high-speed chip, but in a case that the chip is required to be lighter and thinner and the number of chipsets is larger, this heat dissipation manner can not meet the heat dissipation requirement.

In terms of an existing server, a fan is disposed in a side of the server and a heat dissipation fin is disposed on the chipset of the server. Wind formed by the fan is blown to the heat dissipation fin to form a heat dissipation path. However, in this manner, cautious design is required, and a big space is required in the server to form the heat dissipation path, so that the space in the server cannot be fully used.

SUMMARY

The present disclosure is directed to a container system, comprising a main control unit and at least one cabinet. The main control unit is used for outputting a temperature read demand. The cabinet comprises a plurality of serving zones. Each of the serving zones further comprises a master server and at least one slave server. The master server is coupled to the main control unit and used for receiving and outputting a temperature demand. Each slave server is coupled to the master server. The slave server comprises at least one temperature sensor, and the temperature sensor is used for outputting temperature information to the master server when receiving the temperature demand. The master server outputs the temperature information to the main control unit when receiving the temperature information. The main control unit generates and outputs a heat dissipation signal according to the temperature information.

The present disclosure is further directed to a cabinet, coupled to a main control unit. The main control unit is used for outputting a temperature read demand to the cabinet, so as to obtain a corresponding operating temperature. Each cabinet of the present disclosure comprises a plurality of serving zones. Each of the serving zones further comprises a master server and at least one slave server. The master server is coupled to the main control unit and has a Baseboard Management Controller (BMC), where the BMC receives and outputs a temperature demand. The at least one slave server is coupled to the master server, and the slave server comprises at least one temperature sensor. The temperature sensor is used for outputting temperature information to the master server when receiving the temperature demand.

In addition to the foregoing aspects, the present disclosure is further directed to a method for managing heat dissipation of a container system, applicable to a container. The container comprises a cabinet and a plurality of heat dissipation zones. The cabinet comprises a plurality of serving zones, and each of the serving zones comprises a plurality of servers. The method for managing the heat dissipation of the container system of the present disclosure comprises the following steps: receiving a specifying instruction and specifying one of the servers as a master server according to the specifying instruction; generating a temperature demand; transferring the temperature demand to the master server in each of the serving zones in turn; transferring temperature information transferred by the master server in each of the serving zones in turn; generating a fan enable signal according to the temperature information; and deciding whether each of the heat dissipation zones is enabled according to the fan enable signal.

The present disclosure provides a method for managing heat dissipation hierarchically and a system thereof, which obtain a current operating temperature of the slave server in a hierarchical architecture. The operating temperature collected by the master server is transferred to the main control unit. The main control unit judges whether the operating temperature is too high. Through the hierarchical processing, an operating load of the main control unit can be reduced, a network transmission load can be reduced, and the time of the response to heat dissipation control is shorten.

Features and practices of the present invention are described in detail below with reference to embodiments and the accompanying drawings.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

Some embodiments of the present disclosure is directed to a container system, where each cabinet in a container is divided into a plurality of serving zones, each for controlling a heat dissipation zone corresponding to each of the serving zones.

Some embodiments of the present disclosure is directed to a cabinet, divided into a plurality of serving zones, where a master server in each of the serving zones can demand a subordinate slave server to report back a temperature in turn.

Some embodiments of the present disclosure is directed to a method for managing heat dissipation of a container system, where temperature information of each server in a container is collected hierarchically, so as to drive a heat dissipation zone corresponding to a server of a too high temperature.

Figure 1:
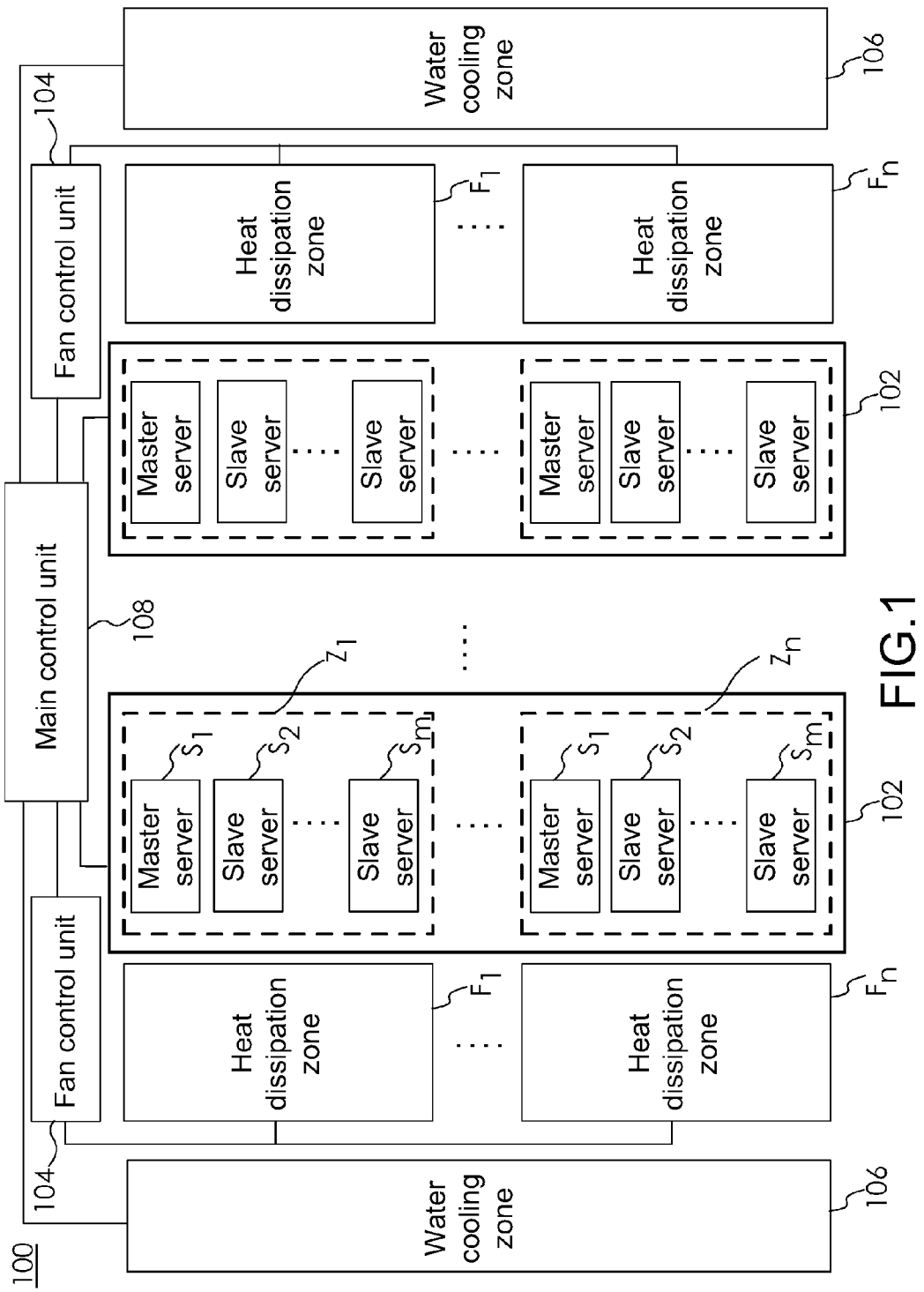
FIG. 1 is a schematic architectural diagram of a container system of the present disclosure.

FIG. 1 depicts a schematic architectural diagram of a container system of the present disclosure. Referring to FIG. 1, the container system 100 of the present disclosure comprises cabinets 102, fan control units 104, heat dissipation zones $F_1$ to $F_n$, water cooling zones 106, and a main control unit 108. It can be easily known by persons skilled in the art that, the container system 100 may accommodate a plurality of cabinets 102. In this embodiment, a server in any cabinet 102 of the container system 100 may be selected to be installed with operating software and firmware for managing the container system 100, so that. In order to distinguish from other servers, the server selected for managing the container system 100 is referred to as main control unit 108.

In this embodiment, a switch (not depicted) or a hub (not depicted) is disposed in each cabinet 102. The fan control unit 104 may also be, for example, a server in any cabinet 102, but the present disclosure is not limited thereto.

The main control unit 108 is coupled to the cabinet 102 and the fan control unit 104. The main control unit 108 is, for example, connected to the cabinet 102 and the fan control unit 104 through the switch (not depicted) or the hub (not depicted) by network lines.

Each cabinet 102 comprises a plurality of serving zones $Z_1$ to $Z_n$, and corresponding heat dissipation zone $F_1$ to $F_n$ are disposed in a side of each serving zone $Z_1$ to $Z_n$. Servers $S_1$ to $S_m$ are disposed in each serving zone $Z_1$ to $Z_n$. In this embodiment, for the purpose of hierarchical management, a server in each serving zone $Z_1$ to $Z_n$ is selected as a main management and control server, and the selected server in each serving zone $Z_1$ to $Z_n$ is referred to as a master server $S_1$, and other servers managed by the master server $S_1$ are named slave servers $S_2$ to $S_m$. The master server $S_1$ may be assigned randomly or determined according to current computation.

In this embodiment, the number of heat dissipation zones $F_1$ to $F_n$ may be, for example, the same as or multiple times of the number of the serving zones $Z_1$ to $Z_n$. For example, one heat dissipation zone is assigned for every two serving zones, but the present disclosure is not limited thereto. The above mentioned m and n are positive integers greater than 0.

In this embodiment, at least one fan is disposed for each heat dissipation zone $F_1$ to $F_n$, and an air outlet of the heat dissipation zone $F_1$ to $F_n$ is adjacent to air inlets of the master server $S_1$ and the slave servers $S_2$ to $S_m$ in each serving zone $Z_1$ to $Z_n$.

Figure 2:
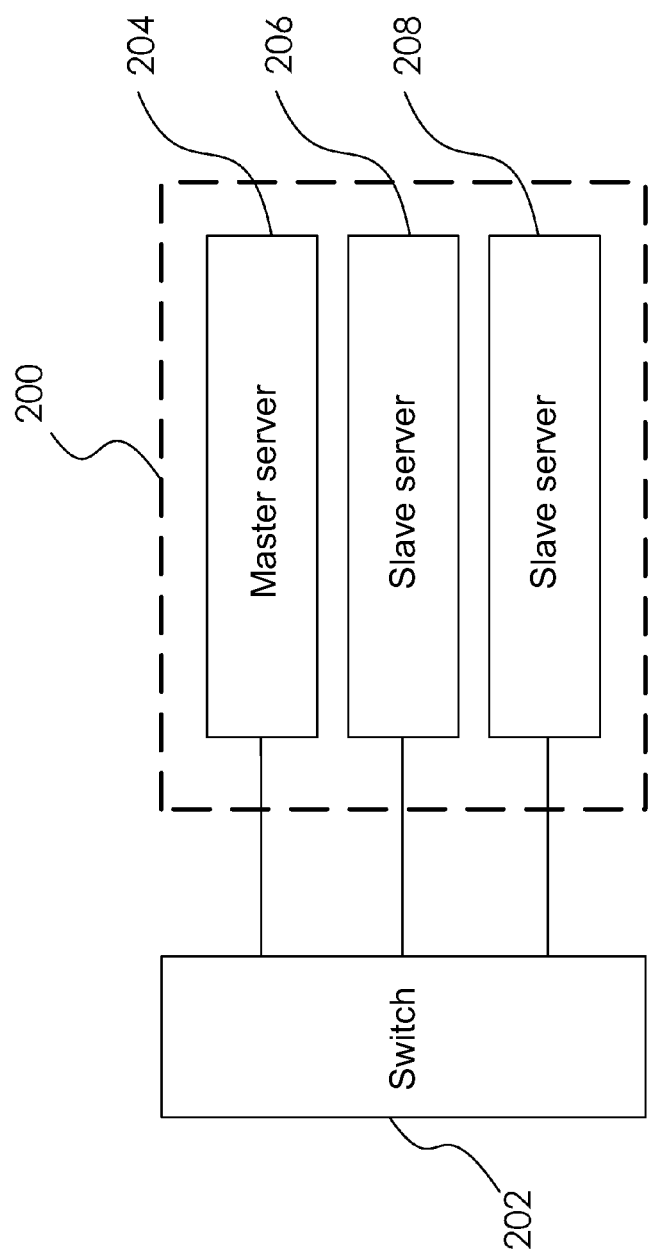
FIG. 2 is a schematic architectural diagram of a part of cabinets of the present disclosure.

FIG. 2 depicts a schematic architecture diagram of a part of cabinets of the present disclosure. Referring to FIG. 2, a master server 204 and slave servers 206 and 208 in a serving zone 200 are connected to a switch 202 through, for example, network line, so that they coupling and communicate with the main control unit 108 in FIG. 1, a server in another serving zone 200, another remote server, or a remote terminal computer through the switch 202.

Referring to FIG. 1, the main control unit 108 is coupled to the water cooling zone 106 to control a motor or a pump (no depicted) of the water cooling zone 106. The motor of the water cooling zone 106 may drive water by pressure. An area of the water cooling zone 106 may cover all or a part of air inlets of all the heat dissipation zones $F_1$ to $F_n$, but the present disclosure is not limited thereto.

Figure 3:
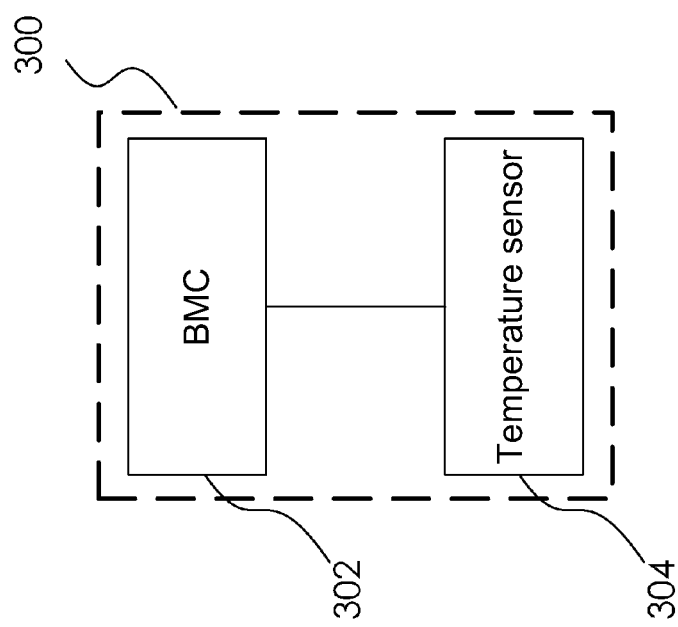
FIG. 3 is a schematic architectural diagram of a server of the present disclosure.

FIG. 3 depicts a schematic architectural diagram of a server of the present disclosure. Referring to FIG. 3, each of the servers 300 (i.e. the master server $S_1$ and slave servers $S_2$ to $S_m$) comprises a BMC 302 and a temperature sensor 304. In practice, the master server $S_1$ and the slave servers $S_2$ to $S_m$ further comprises a CPU, a memory, a south bridge chip, and a network chip, but for conciseness, only the BMC 302 and the temperature sensor 304 are depicted. For example, a plurality of temperature sensors 304 may exist and be respectively disposed on or around a circuit board, the CPU, the memory, the south bridge chip, a display chip, or another component with a high heat generating rate.

Figure 4:
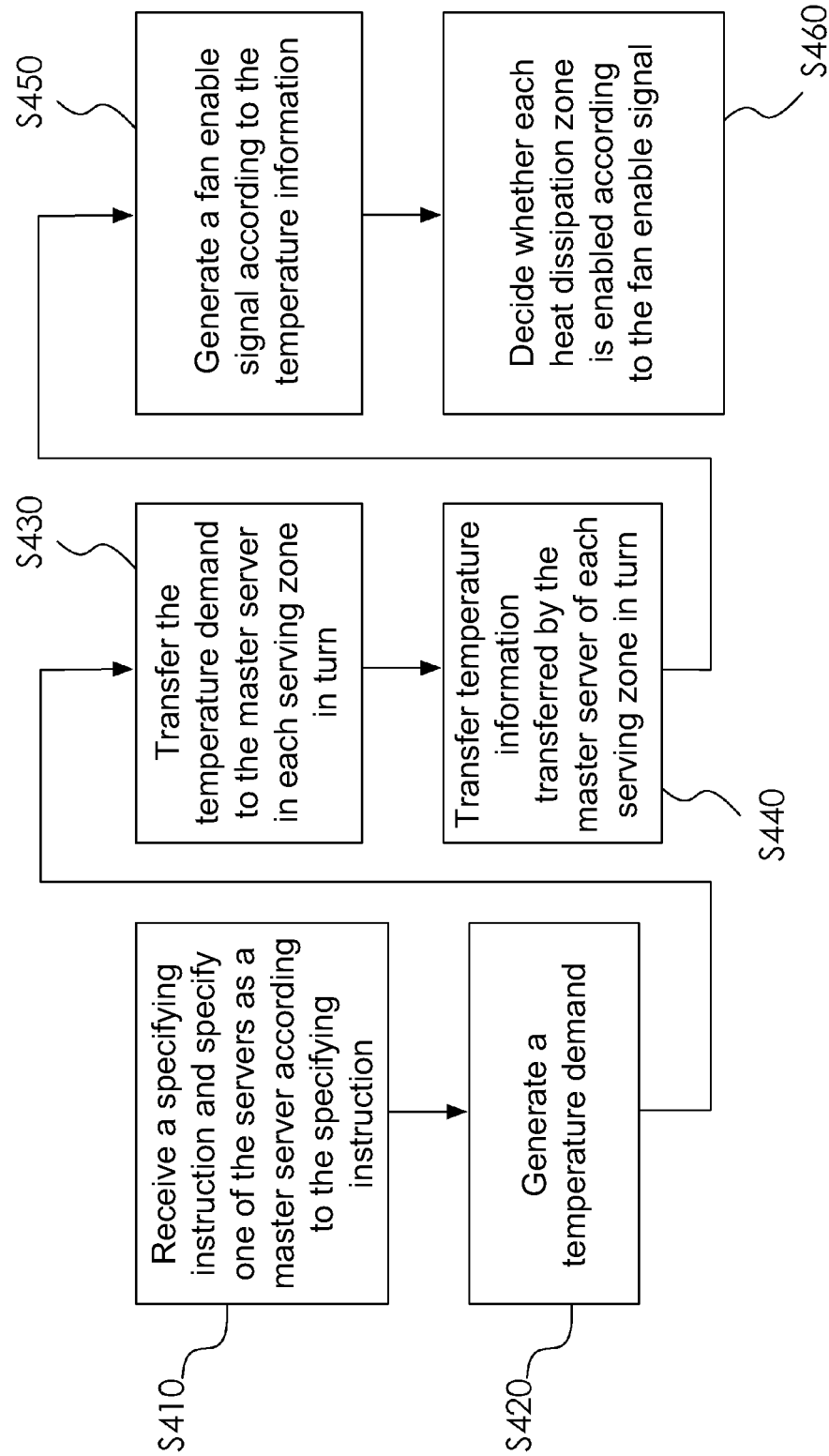
FIG. 4 is a flowchart of steps of a method for managing heat dissipation of a container system of the present disclosure.
Figure 5:
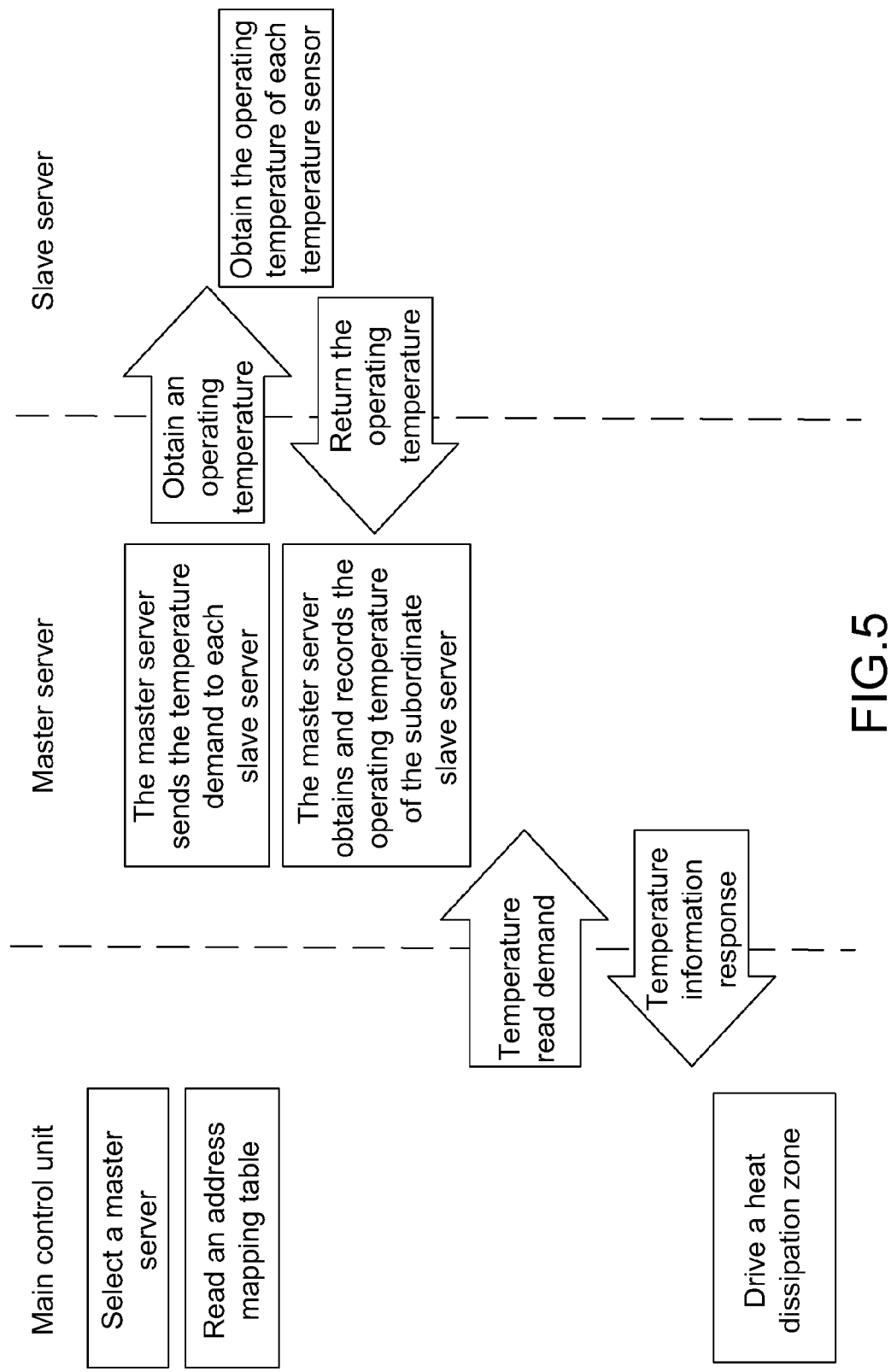
FIG. 5 is a schematic diagram of operations of a container system of the present disclosure.

Reference is made to FIG. 1, FIG. 3, FIG. 4, and FIG. 5. FIG. 4 is a flowchart of a method for managing heat dissipation of a container system of the present disclosure. FIG. 5 is a schematic diagram of operations of the present disclosure. The method for managing the heat dissipation of the container system of the present disclosure comprises following steps. When establishing the container system 100, a server in any cabinet 102 is selected as the main control unit 108 for managing the container system 100. Therefore, after being started up, the main control unit 108 first collects Internet Protocol (IP) addresses of all servers in the container system 100, establishes an address mapping table according to the collected IP addresses, and stores the address mapping table in the main control unit 108. The main control unit 108 may read the address mapping table according to a specified instruction of an operating system or an instruction input by a user, and output an Intelligent Platform Management Interface (IPMI) instruction to the first sever in each serving zone $Z_1$ to $Z_n$ in the cabinet 102 according to configuration in the address mapping table. If the first server returns an acknowledgement signal to the main control unit 108, the main control unit 108 sets the first server to be the master server $S_1$. If the first server returns no acknowledgement signal to the main control unit 108, the main control unit 108 sends the IPMI instruction to another server in each serving zone $Z_1$ to $Z_n$ in turn until the acknowledgement signal returns (Step S410).

The main control unit 108 transfers address data of the slave servers $S_2$ to $S_m$ subordinate to the master server $S_1$ in each serving zone $Z_1$ to $Z_n$ to the master server $S_1$ in the each serving zone $Z_1$ to $Z_n$ according to the address mapping table. Then, the main control unit 108 generates a temperature demand (Step S420).

In this embodiment, the main control unit 108 transfers the temperature demand to the master server $S_1$ in each serving zone $Z_1$ to $Z_n$ in turn. The main control unit 108 outputs the temperature demand in a format of the IPMI instruction to the BMC 302 of the master server $S_1$ in each serving zone $Z_1$ to $Z_n$ (Step S430).

After the BMC 302 of the master server $S_1$ in each serving zone $Z_1$ to $Z_n$ receives the temperature demand, the master server $S_1$ transfers the temperature demand to the BMCs 302 of the subordinate slave servers $S_2$ to $S_m$ in turn (for example, through the IPMI), and then the BMC 302s send commands to control the temperature sensors 304 to return sensed temperatures. After collecting the temperatures (comprising the temperatures of $S_1$ to $S_m$), the temperature sensors 304 output temperature information to the BMC 302 of the master server $S_1$ in each serving zone $Z_1$ to $Z_n$. The BMC 302 of the master server $S_1$ in each serving zone $Z_1$ to $Z_n$ transfers the temperature information to the main control unit 108 in turn. Since the main control unit 108 sends the temperature demands to the master servers at intervals so the master servers $S_1$ will return the temperature information sequentially. Accordingly, no network congestion will occur (Step S440).

Sometimes, the temperature information returned by the BMC 302 may have a partial blank or marking failure. In such case, the temperature sensor 304 cannot return temperature to the BMC 302. In an embodiment of the present disclosure, when continuous blanks or three marking failures occur, the main control unit 108 may sends an alarm signal to notify a manager of the event.

In some embodiments of the present disclosure, the temperature information may be, for example, a CPU temperature value or a non-CPU temperature value, but the present disclosure is not limited thereto.

After receiving the temperature information, the main control unit 108 compares the temperature information with a preset normal value and obtains a heat dissipation signal comprising a comparison result. The main control unit 108 outputs the heat dissipation signal to the fan control unit 104, and the fan control unit 104 generates a fan enable signal according to the heat dissipation signal (Step S450).

The fan control unit 104 outputs the fan enable signal to the heat dissipation zones $F_1$ to $F_n$. The fan enable signal may only be, for example, sent to the heat dissipation zone needed to be activated, or, for example, a fan enable signal of a high level is output to the heat dissipation zone needed to be activated and a fan enable signal of a low level is output to the heat dissipation zone not needed to be activated, which is determined according to design requirements in an actual requirement (Step S460).

In a embodiment of the present disclosure, the fan control unit 104 may also decide whether a water flow speed of the water cooling zone 106 to be increased according to the fan enable signal.

In this embodiment, air around the water cooling zone 106 is in a low temperature state due to low-temperature water in the water cooling zone 106, so when the heat dissipation zone $F_1$ to $F_n$ is activated, a cold wind around the water cooling zone 106 may be drawn from the air inlet. A wind speed and a wind direction are generated through a fan, and then the wind is blown to the corresponding air inlet of the serving zone $Z_1$ to $Z_n$, so as to decrease the temperatures of the servers $S_1$ to $S_m$.

In an embodiment of the present disclosure, the main control unit 108 may send the temperature demand to only a specific serving zone or all the serving zones $Z_1$ to $Z_n$.

The master server $S_1$ may begin to collect operating temperatures of other slave servers $S_2$ to $S_m$ every period of time, and record the collected operating temperature in the period of time. The hierarchical processing of this disclosure may speed up the process of the main control unit 108 collecting the temperatures of the slave servers $S_1$ to $S_m$. In the following, a conventional architecture and the temperature collection of the present disclosure are taken as examples respectively, but the number is not limited. It is assumed that a conventional main control unit 108 spends 0.03 seconds in collecting temperatures from all temperature sensors 304 in a server in a way of single task. If 12 cabinets 102 exist, and each cabinet 102 has 72 servers, the following result is obtained:

$$12 \times 72 \times 0.03 = 25.92 \text{ seconds} \qquad \text{Formula 1}$$

Therefore, the main control unit 108 spends a total of 25.92 seconds in collecting all temperature information. Time required for the main control unit 108 to collect all temperature sensors 304 in 14 slave servers $S_2$ to $S_m$ (comprising the master server $S_1$) in the heat dissipation zones $F_1$ to $F_n$ is:

$$14 \times 0.03 = 0.42 \text{ seconds} \qquad \text{Formula 2}$$

However, the main control unit 108 of the present disclosure does not need to sends a demand to the temperature sensors 304 of the slave servers $S_2$ to $S_m$ one by one. In the present disclosure, a package command for reporting back a temperature is sent to only each master server $S_1$. It is assumed that a response time of a single master server $S_1$ is 0.02 seconds. Therefore, if a command for collecting temperatures from 12 cabinets 102, each comprising five master servers $S_1$ is sent, the required response time is:

$$12 \times 5 \times 0.02 = 1.2 \text{ seconds} \qquad \text{Formula 3}$$

Time from sending the demand to receiving information is:

$$0.42 + 1.2 = 1.62 \text{ seconds} \qquad \text{Formula 4}$$

It can be seen from a comparison result obtained by comparing the result of Formula 4 of the present disclosure with the result of Formula 1 in the prior art, so that the required collection time of this disclosure is obviously shorter than that of the prior art. Therefore, temperature adjustment efficiency is improved.

The present disclosure provides a method for managing heat dissipation hierarchically and a system thereof, which obtain current operating temperatures of the slave servers $S_2$ to $S_m$ in a hierarchical architecture. The operating temperature collected by the master server $S_1$ is transferred to the main control unit 108. The main control unit 108 judges whether the operating temperature is too high. Through the hierarchical processing, an operating load of the main control unit 108 can be reduced, a network transmission load can be reduced, and the time of the response to heat dissipation control is shorten.

What is claimed is:

1. A container system, comprising:
   a main control unit, outputting a temperature read demand; and
   a cabinet, comprising a plurality of serving zones, wherein each of the serving zones comprises:
      a master server, coupled to the main control unit and used for receiving a temperature demand from the main control unit and outputting the temperature demand, the main control unit specifies selectively one of servers as the master server according to a specifying instruction based on an address mapping table; and
      at least one slave server, coupled to the master server and comprising at least one temperature sensor for outputting temperature information to the master server when receiving the temperature demand from the master server, the main control unit specifies selectively others of the servers as the at least one slave server according to the specifying instruction based on the address mapping table,
   wherein when receiving the temperature information, the master server outputs the temperature information to the main control unit, and the main control unit generates and outputs a heat dissipation signal according to the temperature information.

2. The container system according to claim 1, further comprising:
   a fan control unit, coupled to the main control unit, receiving the heat dissipation signal, and used for generating and outputting a fan enable signal; and
   a plurality of heat dissipation zones, corresponding to the serving zones, coupled to the fan control unit, receiving the fan enable signal, and deciding whether the heat dissipation zone is enabled according to the fan enable signal.

3. The container system according to claim 2, further comprising a water cooling zone, disposed at air inlets of the heat dissipation zone and covering all or a part of the heat dissipation zones.

4. A cabinet, coupled to a main control unit outputting a temperature read demand, the cabinet comprising:

a plurality of serving zones, wherein each of the serving zones comprises:
  a master server, coupled to the main control unit and having a Baseboard Management Controller (BMC) for receiving a temperature demand from the main control unit and outputting the temperature demand, the main control unit specifies selectively one of servers as the master server according to a specifying instruction based on an address mapping table; and
  at least one slave server, coupled to the master server and comprising at least one temperature sensor for outputting temperature information to the master server when receiving the temperature demand form the master server, the main control unit specifies selectively others of the servers as the at least one slave server according to the specifying instruction based on the address mapping table.

5. The cabinet according to claim 4, wherein when receiving the temperature information, the master server outputs the temperature information to the main control unit.

6. A method for managing heat dissipation of a container system, applicable to a container, wherein the container comprises a cabinet and a plurality of heat dissipation zones, the cabinet comprises a plurality of serving zones, and each of the serving zones comprises a plurality of servers, the method for managing the heat dissipation of the container system comprising:
  receiving a specifying instruction and specifying selectively one of the servers as a master server according to the specifying instruction based on an address mapping table;
  generating a temperature demand;
  transferring the temperature demand to the master server in each of the serving zones in turn;
  transferring temperature information transferred by the master server in each of the serving zones in turn;
  generating a fan enable signal according to the temperature information; and
  deciding whether each of the heat dissipation zones is enabled according to the fan enable signal;
  wherein the step of transferring the temperature demand to the master server in each of the serving zones in turn comprises:
    the master server receiving the temperature demand; and
    the master server transferring the temperature demand to other servers other than the master server in each of the serving zones in turn.

7. The method for managing the heat dissipation of the container system according to claim 6, wherein the step of transferring the temperature information transferred by the master server in each of the serving zones in turn comprises:
  the master server receiving the temperature information in turn; and
  the master server in each of the serving zones outputting the temperature information in turn.

8. The method for managing the heat dissipation of the container system according to claim 6, further comprising the master server in each of the serving zones storing the temperature information.

9. The method for managing the heat dissipation of the container system according to claim 6, wherein the step of receiving the specifying instruction and specifying one of the servers as the master server according to the specifying instruction comprises:
  receiving the specifying instruction;
  reading an address mapping table and obtaining a data of each of the serving zones;
  specifying one of the servers in each of the serving zones as the master server; and
  transferring the data of each of the serving zones to one, the master server, of the servers in each of the serving zones.

* * * * *